US009646739B2

(12) United States Patent
Shinohara et al.

(10) Patent No.: US 9,646,739 B2
(45) **Date of Patent: *May 9, 2017**

(54) METHOD FOR PRODUCING SILVER-PLATED PRODUCT

(71) Applicant: DOWA METALTECH CO., LTD., Tokyo (JP)

(72) Inventors: Keisuke Shinohara, Saitama (JP); Masafumi Ogata, Saitama (JP); Hiroshi Miyazawa, Saitama (JP); Akira Sugawara, Shizuoka (JP)

(73) Assignee: DOWA METALTECH CO., LTD., Tokyo (JP)

( * ) Notice: Subject to any disclaimer, the term of this patent is extended or adjusted under 35 U.S.C. 154(b) by 107 days.

This patent is subject to a terminal disclaimer.

(21) Appl. No.: 14/348,118

(22) PCT Filed: Sep. 20, 2012

(86) PCT No.: PCT/JP2012/074813

§ 371 (c)(1),
(2) Date: Mar. 28, 2014

(87) PCT Pub. No.: WO2013/047628

PCT Pub. Date: Apr. 4, 2013

(65) Prior Publication Data

US 2015/0243408 A1 Aug. 27, 2015

(30) Foreign Application Priority Data

Sep. 30, 2011 (JP) ................................ 2011-216530

(51) Int. Cl.
*H01B 13/00* (2006.01)
*H01B 5/14* (2006.01)
(Continued)

(52) U.S. Cl.
CPC ................ *H01B 5/14* (2013.01); *C22C 5/06* (2013.01); *C23C 28/02* (2013.01); *C23C 28/021* (2013.01);
(Continued)

(58) Field of Classification Search
CPC ....... C23C 30/00; C23C 30/005; C23C 28/02; C23C 28/021; C23C 28/023; C22C 5/06;
(Continued)

(56) References Cited

U.S. PATENT DOCUMENTS 2,777,810 A 1/1957 Ostrow
4,155,817 A 5/1979 Fletcher et al.
(Continued)

FOREIGN PATENT DOCUMENTS

EP 1939331 A1 2/2008
JP 62247094 A 10/1987
(Continued)

OTHER PUBLICATIONS

Thomson Scientific, London, GB, Week 198749, AN 1987-344363, XP-002737967, Abstract.
(Continued)

*Primary Examiner* — Michael E La Villa
(74) *Attorney, Agent, or Firm* — Bachman & LaPointe, PC

(57) ABSTRACT

There is provided a silver-plated product which has a good bendability and which can restrain the rise of the contact resistance thereof even if it is used in a high-temperature environment, and a method for producing the same. In a silver-plated product wherein a surface layer of silver is formed on the surface of a base material of copper or a copper alloy, or on the surface of an underlying layer of copper or a copper alloy formed on the base material, the percentage of an X-ray diffraction intensity on {200} plane
(Continued)

of the surface layer with respect to the sum of X-ray diffraction intensities on {111}, {200}, {220} and {311} planes of the surface layer is 40% or more.

2 Claims, 2 Drawing Sheets

(51) Int. Cl.

| | |
|---|---|
| ***H01B 1/02*** | (2006.01) |
| ***C22C 5/06*** | (2006.01) |
| ***C23C 30/00*** | (2006.01) |
| ***C25D 3/46*** | (2006.01) |
| ***C25D 7/00*** | (2006.01) |
| ***C23C 28/02*** | (2006.01) |
| ***H01R 13/03*** | (2006.01) |
| ***H01H 1/023*** | (2006.01) |
| ***H01H 11/04*** | (2006.01) |
| *H01R 43/16* | (2006.01) |
| *C25D 5/34* | (2006.01) |

(52) U.S. Cl.

CPC ............ *C23C 28/023* (2013.01); *C23C 30/00* (2013.01); *C23C 30/005* (2013.01); *C25D 3/46* (2013.01); *C25D 7/00* (2013.01); *H01B 1/02* (2013.01); *H01B 13/00* (2013.01); *H01H 1/023* (2013.01); *H01H 11/041* (2013.01); *H01R 13/03* (2013.01); *C25D 5/34* (2013.01); *H01R 43/16* (2013.01); *Y10T 428/12882* (2015.01)

(58) Field of Classification Search

CPC ..... Y10T 428/12896; Y10T 428/12903; Y10T 428/12882; Y10T 428/1291; Y10T 428/12917

See application file for complete search history.

(56) References Cited

U.S. PATENT DOCUMENTS

| | | | | |
|---|---|---|---|---|
| 7,393,473 | B2 | 7/2008 | Miyazawa et al. | |
| 2001/0036526 | A1* | 11/2001 | Fukuzawa ................ | G11B 7/24 428/64.4 |
| 2009/0229987 | A1 | 9/2009 | Miyazawa et al. | |
| 2012/0168800 | A1* | 7/2012 | Kobayashi .............. | H01L 33/60 257/98 |

FOREIGN PATENT DOCUMENTS

| | | | |
|---|---|---|---|
| JP | 2006307277 | A | 11/2006 |
| JP | 2007016250 | A | 1/2007 |
| JP | 3889718 | B2 | 3/2007 |
| JP | 4279285 | B2 | 6/2009 |
| JP | 2010146926 | A | 7/2010 |
| JP | 2010-253045 | A | 11/2010 |
| JP | 2012162775 | A | 8/2012 |
| SU | 620515 | A | 8/1978 |
| WO | WO 2010150824 | * | 12/2010 |

OTHER PUBLICATIONS

Thomson Scientific, London, GB, Week 197925, AN 1979-46841B, XP-002737968, Abstract.

European Search Report for European Application No. 12837569.8 dated Mar. 31, 2015.

* cited by examiner

METHOD FOR PRODUCING SILVER-PLATED PRODUCT

TECHNICAL FIELD

The present invention generally relates to a silver-plated product and a method for producing the same. More specifically, the invention relates to a silver-plated product used as the material of contact and terminal parts, such as connectors, switches and relays, which are used for on-vehicle and/or household electric wiring, and a method for producing the same.

BACKGROUND ART

As conventional materials of contact and terminal parts, such as connectors and switches, there are used plated products wherein a base material of stainless steel, copper, a copper alloy or the like, which is relatively inexpensive and which has excellent corrosion resistance, mechanical characteristics and so forth, is plated with tin, silver, gold or the like in accordance with required characteristics, such as electrical and soldering characteristics.

Tin-plated products obtained by plating a base material of stainless steel, copper, a copper alloy or the like, with tin are inexpensive, but they do not have good corrosion resistance. Gold-plated products obtained by plating such a base material with gold have excellent corrosion resistance and high responsibility, but the costs thereof are high. On the other hand, silver-plated products obtained by plating such a base material with silver are inexpensive in comparison with gold-plated products and have excellent corrosion resistance in comparison with tin-plated products.

As a silver-plated product obtained by plating a base material of stainless steel, copper, a copper alloy or the like with silver, there is proposed a metal plate for electrical contacts, wherein a silver plating film having a thickness of 1 micrometer is formed on a copper plating film having a thickness of 0.1 to 0.5 micrometers which is formed thereon on a nickel plating film having a thickness of 0.1 to 0.3 micrometers which is formed on the surface of a thin base material plate of stainless steel (see, e.g., Japanese Patent No. 3889718). There is also proposed a silver-coated stainless bar for movable contacts, wherein a surface layer of silver or a silver alloy having a thickness of 0.5 to 2.0 micrometers is formed on an intermediate layer of at least one of nickel, a nickel alloy, copper and a copper alloy having a thickness of 0.05 to 0.2 micrometers, the intermediate layer being formed on an activated underlying layer of nickel which has a thickness of 0.01 to 0.1 micrometers and which is formed on a base material of stainless steel (see, e.g., Japanese Patent No. 4279285). Moreover, there is proposed a silver-coated material for movable contact parts, wherein a surface layer of silver or a silver alloy having a thickness of 0.2 to 1.5 micrometers is formed on an intermediate layer of copper or a copper alloy having a thickness of 0.01 to 0.2 micrometers, the intermediate layer being formed on an underlying layer of any one of nickel, a nickel alloy, cobalt or a cobalt alloy which has a thickness of 0.005 to 0.1 micrometers and which is formed on a metallic substrate of copper, a copper alloy, iron or an iron alloy, the arithmetic average roughness Ra of the metallic substrate being 0.001 to 0.2 micrometers, and the arithmetic average roughness Ra after forming the intermediate layer being 0.001 to 0.1 micrometers (see, e.g., Japanese patent Laid-Open No. 2010-146925).

However, when conventional silver-plated products are used in a high-temperature environment, there are some possibility that the adhesion properties of the plating film may be deteriorated and/or the contact resistance of the product may be very high. When the silver-plated products proposed in Japanese Patent Nos. 3889718 and 4279285 are used in a high-temperature environment, there are some possibility that the adhesion properties of the plating film may be deteriorated and that the rise of the contact resistance of the product cannot be sufficiently restrained. On the other hand, when the silver-plated product proposed in Japanese Patent Laid-Open No. 2010-146926 is used in a high-temperature environment, the adhesion properties of the plating film are good, and the rise of the contact resistance of the product can be restrained. However, it is required to adjust the arithmetic average roughness Ra of a pressure roll to be 0.001 to 0.2 micrometers so that the arithmetic average roughness Ra of a metallic substrate, which is transferred by the pressure roll, is adjusted to be 0.001 to 0.2 micrometers. It is also required to appropriately choose the current density in plating and the kinds of additives in a plating solution during the formation of the intermediate layer to adjust the arithmetic average roughness Ra to be 0.001 to 0.1 micrometers after forming the intermediate layer, so that the process is complicated and the costs thereof are increased.

For that reason, the applicant has proposed to produce an inexpensive silver-plated product, which has good adhesion properties of the plating film and which can restrain the rise of the contact resistance of the product even if it is used in a high-temperature environment, by causing the crystalline diameter in a direction perpendicular to {111} plane of the surface layer to be 300 angstroms or more in a silver-plated product wherein a surface layer of Ag is formed on an intermediate layer of Cu which is formed on an underlying layer of Ni formed on the surface of a base material of stainless steel (Japanese Patent Application No. 2010-253045).

However, in a silver-plated product wherein a silver plating film is formed on the surface of a base material of copper or a copper alloy, or on the surface of an underlying layer of copper or a copper alloy formed on a base material, there is a problem in that copper diffuses to form CuO on the surface of the silver plating film to raise the contact resistance thereof if it is used in a high-temperature environment. There is also a problem in that cracks are formed in the silver-plated product to expose the base material if the silver-plated product is worked in a complicated shape or in a shape of small contact and terminal parts, such as connectors and switches.

DISCLOSURE OF THE INVENTION

It is therefore an object of the present invention to eliminate the above-described conventional problems and to provide a silver-plated product, which has a good bendability and which can restrain the rise of the contact resistance thereof even if it is used in a high-temperature environment, and a method for producing the same.

In order to accomplish the aforementioned object, the inventors have diligently studied and found that it is possible to produce a silver-plated product, which has a good bendability and which can restrain the rise of the contact resistance thereof even if it is used in a high-temperature environment, by controlling the crystal orientation forming a surface layer of silver, specifically, by enhancing the percentage of an X-ray diffraction intensity (an integrated intensity at an X-ray diffraction peak) on {200} plane of the surface layer with respect to the sum of X-ray diffraction intensities on {111}, {200}, {220} and {311} planes (which are main orientation modes in a silver crystal) of the surface layer (this percentage will be hereinafter referred to as a "{200} orientation intensity ratio") to 40% or more. Thus, the inventors have made the present invention.

According to the present invention, there is provided a silver-plated product comprising: a base material; and a surface layer of silver which is formed on a surface of the base material or on a surface of an underlying layer formed on the base material, wherein a percentage of an X-ray diffraction intensity on {200} plane of the surface layer with respect to the sum of X-ray diffraction intensities on {111}, {200}, {220} and {311} planes of the surface layer is 40% or more. In this silver-plated product, the surface layer of silver is preferably formed on the surface of the base material of copper or a copper alloy, or on the surface of the underlying layer of copper or a copper alloy formed on the base material.

According to the present invention, there is provided a method for producing a silver-plated product, the method comprising the steps of: preparing a base material; and forming a surface layer of silver on a surface of the base material or on a surface of an underlying layer formed on the base material, wherein the surface layer of silver is formed by electroplating in a silver plating bath which contains 5 to 15 mg/L of selenium and wherein a mass ratio of silver to free cyanogen is in the range of from 0.9 to 1.8. In this method for producing a silver-plated product, the surface layer of silver is preferably formed on the surface of the base material of copper or a copper alloy, or on the surface of the underlying layer of copper or a copper alloy formed on the base material. The silver plating bath preferably comprises silver potassium cyanide, potassium cyanide and potassium selenocyanate, the concentration of potassium selenocyanate in the silver plating bath being 3 to 30 mg/L.

According to the present invention, there is provided a contact or terminal part which is made of the above-described silver-plated product.

According to the present invention, it is possible to produce a silver-plated product, which has a good bendability and which can restrain the rise of the contact resistance thereof even if it is used in a high-temperature environment.

A silver-plated product according to the present invention can be used as the material of contact and terminal parts, such as connectors, switches and relays, which are used for on-vehicle and/or household electric wiring. In particular, the silver-plated product can be used as the material of spring-loaded contact members for switches, as well as portable cellular phones and/or remote controllers of electrical apparatuses. The silver-plated product can be also used as the material of charge terminals and high-pressure connectors of hybrid electric vehicles (HEVs) in which heavy-current flow and which have large heating values.

BEST MODE FOR CARRYING OUT THE INVENTION

Figure 1:
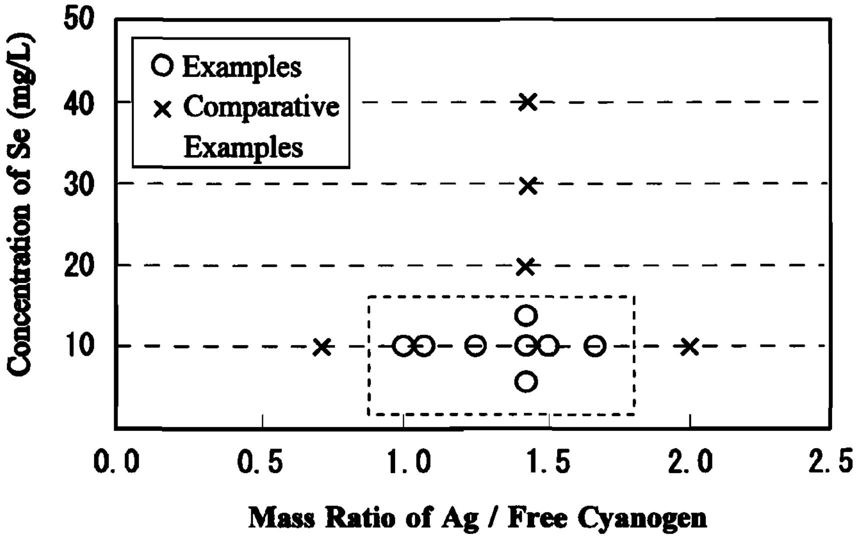
FIG. 1 is a graph showing the concentration of Se with respect to the mass ratio of Ag to free CN in silver plating baths used for producing silver-plated products in Examples 1-8 and Comparative Examples 1-5.
Figure 2:
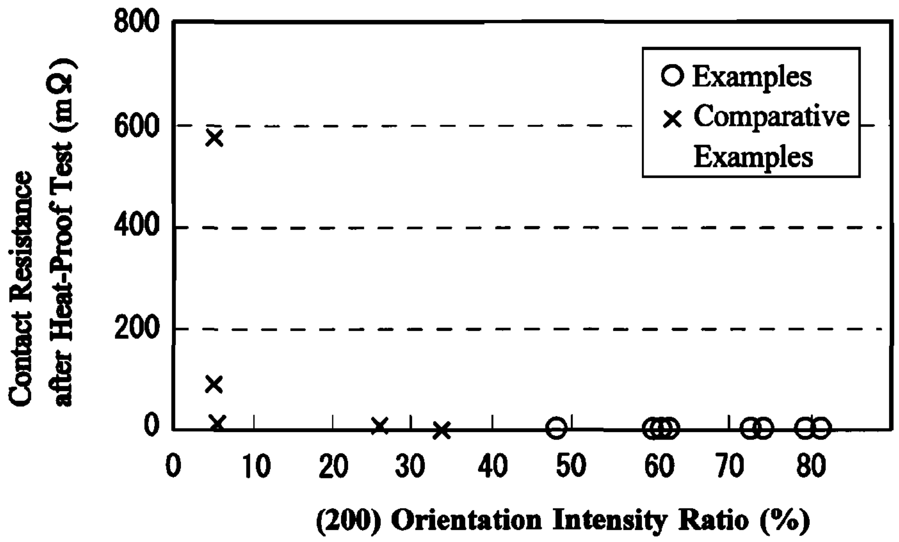
FIG. 2 is a graph showing the contact resistance after the heat-proof test with respect to the {200} orientation intensity ratio of silver-plated products obtained in Examples 1-8 and Comparative Examples 1-5.
Figure 3:
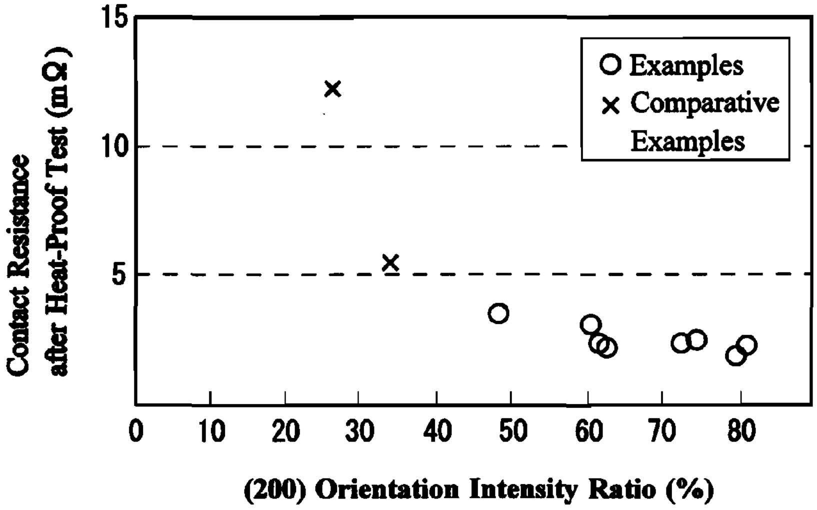
FIG. 3 is a graph showing the contact resistance after the heat-proof test with respect to the {200} orientation intensity ratio of silver-plated products obtained in Examples 1-8 and Comparative Examples 1-2.

In the preferred embodiment of a silver-plated product according to the present invention, a surface layer of silver is formed on the surface of a base material or on the surface of an underlying layer formed on the base material, and the percentage of the X-ray diffraction intensity on {200} plane of the surface layer with respect to the sum of the X-ray diffraction intensities on {111}, {200}, {220} and {311} planes of the surface layer is 40% or more. In this silver-plated product, the surface layer of silver is preferably formed on the surface of the base material of copper or a copper alloy, or on the surface of the underlying layer of copper or a copper alloy formed on the base material.

In the preferred embodiment of a method for producing a silver-plated product according to the present invention, a surface layer of silver is formed on the surface of a base material or on the surface of an underlying layer formed on the base material so that the percentage of the X-ray diffraction intensity on {200} plane of the surface layer with respect to the sum of the X-ray diffraction intensities on {111}, {200}, {220} and {311} planes of the surface layer is 40% or more.

Specifically, in a method for producing a silver-plated product wherein a surface layer of silver is formed on the surface of a base material or on the surface of an underlying layer formed on the base material, the surface layer (preferably having a thickness of 10 micrometer or less) is formed by electroplating in a silver plating bath which contains 5 to 15 mg/L of selenium and wherein a mass ratio of silver to free cyanogen is in the range of from 0.9 to 1.8. In this method for producing a silver-plated product, the surface layer of silver is preferably formed on the surface of the base material of copper or a copper alloy, or on the surface of the underlying layer of copper or a copper alloy formed on the base material. Furthermore, during the electroplating, the temperature of the solution is preferably 10 to 40° C., more preferably 15 to 30 and the current density is preferably 1 to 15 A/dm$^2$, more preferably 3 to 10 A/dm$^2$.

The silver plating bath is preferably a silver plating bath which comprises silver potassium cyanide ($KAg(CN)_2$), potassium cyanide (KCN), and 3 to 30 mg/L of potassium selenocyanate (KSeCN) and wherein the concentration of selenium in the silver plating bath is 5 to 15 mg/L, the mass ratio of silver to free cyanogen being in the range of from 0.9 to 1.8.

Furthermore, the surface layer of the silver-plated product contains silver, and may be made of a silver alloy if it is possible to form such a surface layer that the percentage of the X-ray diffraction intensity on {200} plane with respect to the sum of the X-ray diffraction intensities on {111}, {200}, {220} and {311} planes is 40% or more by electroplating in a silver plating bath which contains 5 to 15 mg/L of selenium and wherein a mass ratio of silver to free cyanogen is in the range of from 0.9 to 1.8.

Examples of a silver-plated product and a method for producing the same according to the present invention will be described below in detail.

Example 1

First, a pure copper plate having a size of 67 mm×50 mm×0.3 mm was prepared as a base material (a material to be plated). The material to be plated and a SUS plate were put in an alkali degreasing solution to be used as a cathode and an anode, respectively, to carry out electrolytic degreasing at 5 V for 30 seconds. The material thus electrolytic-degreased was washed, and then, pickled for 15 seconds in a 3% sulfuric acid.

Then, the material to be plated and a titanium electrode plate coated with platinum were used as a cathode and an anode, respectively, to electroplate (silver-strike-plate) the material at a current density of 2.5 A/dm$^2$ for 10 seconds in a silver strike plating bath comprising 3 g/L of silver potassium cyanide and 90 g/L of potassium cyanide while stirring the solution at 400 rpm by a stirrer.

Then, the material to be plated and a silver electrode plate were used as a cathode and an anode, respectively, to electroplate (silver-plate) the material at a current density of 5 A/dm$^2$ and a liquid temperature of 18° C. in a silver plating bath comprising 74 g/L of silver potassium cyanide ($KAg(CN)_2$), 100 g/L of potassium cyanide and 18 mg/L of potassium selenocyanate (KSeCN) while stirring the solution at 400 rpm by a stirrer, until a silver plating film having a thickness of 3 micrometers was formed. Furthermore, in the used silver plating bath, the concentration of Se was 10 mg/L, and the concentration of Ag was 40 g/L, the concentration of free CN being 40 g/L, and the mass ratio of Ag to free CN being 1.0.

With respect to a silver-plated product thus produced, the {200} orientation intensity ratio thereof was calculated, and the contact resistances thereof before and after a heat-proof test and the bendability thereof were evaluated.

The {200} orientation intensity ratio of the silver-plated product was calculated as the proportion of the integrated intensity at an X-ray diffraction peak on {200} plane of the silver plating film with respect to the sum of the integrated intensities at X-ray diffraction peaks on {111}, {200}, {220} and {311} planes of the silver plating film, the integrated intensities being obtained from an X-ray diffraction pattern which was obtained at a tube voltage of 30 kV and a tube current 30 mA in a sampling width of 0.020° using an X-ray tube of Cu, a monochrometer and a glass sample holder by means of an X-ray diffraction (XRD) analyzer (RINT-3C produced by RIGAKU Corporation). As a result, the {200} orientation intensity ratio was 62.3%.

The heat resisting property of the silver-plated product was evaluated by measuring a contact resistance thereof at a load of 50 gf by means of an electrical contact simulator (CRS-1 produced by Yamasaki-Seiki Co., Ltd.) before and after a heat-proof test in which the silver-plated product was heated at 200° C. for 144 hours by means of a dryer (OF450 produced by AS ONE Corporation). As a result, the contact resistance of the silver-plated product was 0.9 mΩ before the heat-proof test and 2.3 mΩ after the heat-proof test. Thus, the contact resistance after the heat-proof test was a good value which was not higher than 5 mΩ, so that the rise of the contact resistance was restrained after the heat-proof test.

The bendability of the silver-plated product was evaluated on the basis of the presence of cracks in a bent portion of the silver-plated product by observing the bent portion at a power of 1000 by means of a microscope (Digital Microscope VHX-1000 produced by KEYENCE CORPORATION) after the silver-plated product was bent by 90 degrees at R=0.1 in a direction perpendicular to the direction of rolling of the base material in accordance with the V-block method described in Japanese Industrial Standard (JIS) 22248. As a result, cracks were not observed, so that the bendability of the silver-plated product was good.

Example 2

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18° C. in a silver plating bath comprising 111 g/L of silver potassium cyanide, 100 g/L of potassium cyanide and 18 mg/L of potassium selenocyanate while stirring the solution at 400 rpm by a stirrer, until a silver plating film having a thickness of 3 micrometers was formed. Furthermore, in the used silver plating bath, the concentration of Se was 10 mg/L, and the concentration of Ag was 60 g/L, the concentration of free CN being 40 g/L, and the mass ratio of Ag to free CN being 1.5.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 61.6%. The contact resistance of the silver-plated product was 0.8 mΩ before the heat-proof test and 2.5 mΩ after the heat-proof test. Thus, the contact resistance after the heat-proof test was a good value which was not higher than 5 mΩ, so that the rise of the contact resistance was restrained after the heat-proof test. Moreover, cracks were not observed in the silver-plated product after bending, so that the bendability of the silver-plated product was good.

Example 3

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18° C. in a silver plating bath comprising 111 g/L of silver potassium cyanide, 120 g/L of potassium cyanide and 18 mg/L of potassium selenocyanate while stirring the solution at 400 rpm by a stirrer, until a silver plating film having a thickness of 3 micrometers was formed. Furthermore, in the used silver plating bath, the concentration of Se was 10 mg/L, and the concentration of Ag was 60 g/L, the concentration of free CN being 48 g/L, and the mass ratio of Ag to free CN being 1.3.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 74.4%. The contact resistance of the silver-plated product was 0.9 ma before the heat-proof test and 2.5 mΩ after the heat-proof test. Thus, the contact resistance after the heat-proof test was a good value which was not higher than 5 mΩ, so that the rise of the contact resistance was restrained after the heat-proof test. Moreover, cracks were not observed in the silver-plated product after bending, so that the bendability of the silver-plated product was good.

Example 4

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18° C. in a silver plating bath comprising 111 g/L of silver potassium cyanide, 140 g/L of potassium cyanide and 18 mg/L of potassium selenocyanate while stirring the solution at 400 rpm by a stirrer, until a silver plating film having a thickness of 3 micrometers was formed. Furthermore, in the used silver plating bath, the concentration of Se was 10 mg/L, and the concentration of Ag was 60 g/L, the concentration of free CN being 58 g/L, and the mass ratio of Ag to free CN being 1.1.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 60.4%. The contact resistance of the silver-plated product was 0.8 mΩ before the heat-proof test and 3.2 mΩ after the heat-proof test. Thus, the contact resistance after the heat-proof test was a good value which was not higher than 5 mΩ, so that the rise of the contact resistance was restrained after the heat-proof test. Moreover, cracks were not observed in the silver-plated product after bending, so that the bendability of the silver-plated product was good.

Example 5

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18° C. in a silver plating bath comprising 148 g/L of silver potassium cyanide, 120 g/L of potassium cyanide and 18 mg/L of potassium selenocyanate while stirring the solution at 400 rpm by a stirrer, until a silver plating film having a thickness of 3 micrometers was formed. Furthermore, in the used silver plating bath, the concentration of Se was 10 mg/L, and the concentration of Ag was 80 g/L, the concentration of free CN being 48 g/L, and the mass ratio of Ag to free CN being 1.7.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 79.9%. The contact resistance of the silver-plated product was 0.7 mΩ before the heat-proof test and 2.0 mΩ after the heat-proof test. Thus, the contact resistance after the heat-proof test was a good value which was not higher than 5 mΩ, so that the rise of the contact resistance was restrained after the heat-proof test. Moreover, cracks were not observed in the silver-plated product after bending, so that the bendability of the silver-plated product was good.

Example 6

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18° C. in a silver plating bath comprising 148 g/L of silver potassium cyanide, 140 g/L of potassium cyanide and 18 mg/L of potassium selenocyanate while stirring the solution at 400 rpm by a stirrer, until a silver plating film having a thickness of 3 micrometers was formed. Furthermore, in the used silver plating bath, the concentration of Se was 10 mg/L, and the concentration of Ag was 80 g/L, the concentration of free CN being 56 g/L, and the mass ratio of Ag to free CN being 1.4.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 72.7%. The contact resistance of the silver-plated product was 0.9 mΩ before the heat-proof test and 2.4 mΩ after the heat-proof test. Thus, the contact resistance after the heat-proof test was a good value which was not higher than 5 mΩ, so that the rise of the contact resistance was restrained after the heat-proof test. Moreover, cracks were not observed in the silver-plated product after bending, so that the bendability of the silver-plated product was good.

Example 7

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18° C. in a silver plating bath comprising 148 g/L of silver potassium cyanide, 140 g/L of potassium cyanide and 11 mg/L of potassium selenocyanate while stirring the solution at 400 rpm by a stirrer, until a silver plating film having a thickness of 3 micrometers was formed. Furthermore, in the used silver plating bath, the concentration of Se was 6 mg/L, and the concentration of Ag was 80 g/L, the concentration of free CN being 56 g/L, and the mass ratio of Ag to free CN being 1.4.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 81.2%. The contact resistance of the silver-plated product was 1.0 mΩ before the heat-proof test and 2.4 mΩ after the heat-proof test. Thus, the contact resistance after the heat-proof test was a good value which was not higher than 5 mΩ, so that the rise of the contact resistance was restrained after the heat-proof test. Moreover, cracks were not observed in the silver-plated product after bending, so that the bendability of the silver-plated product was good.

Example 8

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18°

C. in a silver plating bath comprising 148 g/L of silver potassium cyanide, 140 g/L of potassium cyanide and 26 mg/L of potassium selenocyanate while stirring the solution at 400 rpm by a stirrer, until a silver plating film having a thickness of 3 micrometers was formed. Furthermore, in the used silver plating bath, the concentration of Se was 14 mg/L, and the concentration of Ag was 80 g/L, the concentration of free CN being 56 g/L, and the mass ratio of Ag to free CN being 1.4.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 48.1%. The contact resistance of the silver-plated product was 0.8 mΩ before the heat-proof test and 3.6 mΩ after the heat-proof test. Thus, the contact resistance after the heat-proof test was a good value which was not higher than 5 mΩ, so that the rise of the contact resistance was restrained after the heat-proof test. Moreover, cracks were not observed in the silver-plated product after bending, so that the bendability of the silver-plated product was good.

Comparative Example 1

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18 in a silver plating bath comprising 74 g/L of silver potassium cyanide, 140 g/L of potassium cyanide and 18 mg/L of potassium selenocyanate while stirring the solution at 400 rpm by a stirrer, until a silver plating film having a thickness of 3 micrometers was formed. Furthermore, in the used silver plating bath, the concentration of Se was 10 mg/L, and the concentration of Ag was 40 g/L, the concentration of free CN being 56 g/L, and the mass ratio of Ag to free CN being 0.7.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 33.6%. The contact resistance of the silver-plated product was 0.8 mΩ before the heat-proof test and 5.6 mΩ after the heat-proof test. Thus, the contact resistance after the heat-proof test was not a good value which was not higher than 5 mΩ, so that the contact resistance was raised after the heat-proof test. Moreover, cracks were observed in the silver-plated product after bending, and the base material was exposed, so that the bendability of the silver-plated product was not good.

Comparative Example 2

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18° C. in a silver plating bath comprising 148 g/L of silver potassium cyanide, 100 g/L of potassium cyanide and 18 mg/L of potassium selenocyanate while stirring the solution at 400 rpm by a stirrer, until a silver plating film having a thickness of 3 micrometers was formed. Furthermore, in the used silver plating bath, the concentration of Se was 10 mg/L, and the concentration of Ag was 80 g/L, the concentration of free CN being 40 g/L, and the mass ratio of Ag to free CN being 2.0.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 25.9%. The contact resistance of the silver-plated product was 0.9 mΩ before the heat-proof test and 12.3 mΩ after the heat-proof test. Thus, the contact resistance after the heat-proof test was not a good value which was not higher than 5 mΩ, so that the contact resistance was raised after the heat-proof test. Moreover, cracks were observed in the silver-plated product after bending, and the base material was exposed, so that the bendability of the silver-plated product was not good.

Comparative Example 3

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18° C. in a silver plating bath comprising 148 g/L of silver potassium cyanide, 140 g/L of potassium cyanide and 36 mg/L of potassium selenocyanate while stirring the solution at 400 rpm by a stirrer, until a silver plating film having a thickness of 3 micrometers was formed. Furthermore, in the used silver plating bath, the concentration of Se was 20 mg/L, and the concentration of Ag was 80 g/L, the concentration of free CN being 56 g/L, and the mass ratio of Ag to free CN being 1.4.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 5.4%. The contact resistance of the silver-plated product was 0.9 mΩ before the heat-proof test and 15.7 mΩ after the heat-proof test. Thus, the contact resistance after the heat-proof test was not a good value which was not higher than 5 mΩ, so that the contact resistance was raised after the heat-proof test. Moreover, cracks were observed in the silver-plated product after bending, and the base material was exposed, so that the bendability of the silver-plated product was not good.

Comparative Example 4

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18° C. in a silver plating bath comprising 148 g/L of silver potassium cyanide, 140 g/L of potassium cyanide and 55 mg/L of potassium selenocyanate while stirring the solution at 400 rpm by a stirrer, until a silver plating film having a thickness of 3 micrometers was formed. Furthermore, in the used silver plating bath, the concentration of Se was 30 mg/L, and the concentration of Ag was 80 g/L, the concentration of free CN being 56 g/L, and the mass ratio of Ag to free CN being 1.4.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 5.1%. The contact resistance of the silver-plated product was 0.7 mΩ before the heat-proof test and 94.2 mΩ after the heat-proof test. Thus, the contact resistance after the heat-proof test was not a good value which was not higher than 5 mΩ, so that the contact resistance was raised after the heat-proof test. Moreover, cracks were observed in the silver-plated product after bending, and the base material was exposed, so that the bendability of the silver-plated product was not good.

Comparative Example 5

A silver-plated product was produced by the same method as that in Example 1, except that a material to be plated and a silver electrode plate were used as a cathode and an anode, respectively, to electroplate (silver-plate) the material at a current density of 5 A/dm$^2$ and a liquid temperature of 18° C. in a silver plating bath comprising 148 g/L of silver potassium cyanide, 140 g/L of potassium cyanide and 73 mg/L of potassium selenocyanate while stirring the solution at 400 rpm by a stirrer, until a silver plating film having a thickness of 3 micrometers was formed. Furthermore, in the used silver plating bath, the concentration of Se was 40 mg/L, and the concentration of Ag was 80 g/L, the concentration of free CN being 56 g/L, and the mass ratio of Ag to free CN being 1.4.

With respect to a silver-plated product thus produced, the {200} orientation intensity ratio thereof was calculated by the same method as that in Example 1, and the contact resistances thereof before and after the heat-proof test and the bendability thereof were evaluated by the same methods as those in Example 1. As a result, the {200} orientation intensity ratio was 4.8%. The contact resistance of the silver-plated product was 0.7 mΩ before the heat-proof test and 574.5 mΩ after the heat-proof test. Thus, the contact resistance after the heat-proof test was not a good value which was not higher than 5 mΩ, so that the contact resistance was raised after the heat-proof test. Moreover, cracks were observed in the silver-plated product after bending, and the base material was exposed, so that the bendability of the silver-plated product was not good.

The composition of the silver plating bath used for producing the silver-plated product in each of Examples 1-8 and Comparative Examples 1-5 is shown in Table 1, and the characteristics of the silver-plated product are shown in Table 2.

TABLE 1

| | Composition of Silver Plating Bath | | | Silver Plating Bath | | | |
|---|---|---|---|---|---|---|---|
| | $KAg(CN)_2$ (g/L) | KCN (g/L) | KSeCN (mg/L) | Se (mg/L) | Ag (g/L) | Free CN (g/L) | Ag/ Free CN |
| Ex. 1 | 74 | 100 | 18 | 10 | 40 | 40 | 1.0 |
| Ex. 2 | 111 | 100 | 18 | 10 | 60 | 40 | 1.5 |
| Ex. 3 | 111 | 120 | 18 | 10 | 60 | 48 | 1.3 |
| Ex. 4 | 111 | 140 | 18 | 10 | 60 | 56 | 1.1 |
| Ex. 5 | 148 | 120 | 18 | 10 | 80 | 48 | 1.7 |
| Ex. 6 | 148 | 140 | 18 | 10 | 80 | 56 | 1.4 |
| Ex. 7 | 148 | 140 | 11 | 6 | 80 | 56 | 1.4 |
| Ex. 8 | 148 | 140 | 26 | 14 | 80 | 56 | 1.4 |
| Comp. 1 | 74 | 140 | 18 | 10 | 40 | 56 | 0.7 |
| Comp. 2 | 148 | 100 | 18 | 10 | 80 | 40 | 2.0 |
| Comp. 3 | 148 | 140 | 36 | 20 | 80 | 56 | 1.4 |
| Comp. 4 | 148 | 140 | 55 | 30 | 80 | 56 | 1.4 |
| Comp. 5 | 148 | 140 | 73 | 40 | 80 | 56 | 1.4 |

TABLE 2

| | (200) Orientation Intensity Ratio (%) | Contact Resistance before Heat-Proof Test (mΩ) | Contact Resistance after Heat-Proof Test (mΩ) | Bendability (Presence of Cracks) |
|---|---|---|---|---|
| Ex. 1 | 62.3 | 0.9 | 2.3 | No Cracks |
| Ex. 2 | 61.6 | 0.8 | 2.5 | No Cracks |
| Ex. 3 | 74.4 | 0.9 | 2.5 | No Cracks |
| Ex. 4 | 60.4 | 0.8 | 3.2 | No Cracks |
| Ex. 5 | 79.9 | 0.7 | 2.0 | No Cracks |
| Ex. 6 | 72.7 | 0.9 | 2.4 | No Cracks |
| Ex. 7 | 81.2 | 1.0 | 2.4 | No Cracks |
| Ex. 8 | 48.1 | 0.8 | 3.6 | No Cracks |
| Comp. 1 | 33.6 | 0.8 | 5.6 | Cracks |
| Comp. 2 | 25.9 | 0.9 | 12.3 | Cracks |
| Comp. 3 | 5.4 | 0.9 | 15.7 | Cracks |
| Comp. 4 | 5.1 | 0.7 | 94.2 | Cracks |
| Comp. 5 | 4.8 | 0.7 | 574.5 | Cracks |

The invention claimed is:

1. A method for producing a silver-plated product, the method comprising the steps of:

preparing a base material; and forming a surface layer of silver on a surface of the base material or on a surface of an underlying layer formed on the base material, wherein the surface layer is formed by electroplating in a silver plating bath which comprises silver potassium cyanide, potassium cyanide and potassium selenocyanate, the concentration of potassium selenocyanate in the silver plating bath being 11 to 30 mg/L, and wherein a mass ratio of silver to free cyanogen in the silver plating bath is in the range of from 0.9 to 1.8, and wherein a percentage of an X-ray diffraction intensity on {200} plane of the surface layer with respect to the sum of X-ray diffraction intensities on {111}, {200}, {220} and {311} planes of the surface layer is 48.1% or more.

2. A method for producing a silver-plated product as set forth in claim 1, wherein said surface layer is formed on the surface of the base material of copper or a copper alloy, or on the surface of the underlying layer of copper or a copper alloy formed on the base material.

* * * * *